US012725755B2

(12) United States Patent
Asahata

(10) Patent No.: US 12,725,755 B2
(45) Date of Patent: Sep. 1, 2026

(54) SAMPLE PIECE RELOCATING DEVICE

(71) Applicant: HITACHI HIGH-TECH ANALYSIS CORPORATION, Tokyo (JP)

(72) Inventor: Tatsuya Asahata, Tokyo (JP)

(73) Assignee: HITACHI HIGH-TECH ANALYSIS CORPORATION, Tokyo (JP)

( * ) Notice: Subject to any disclaimer, the term of this patent is extended or adjusted under 35 U.S.C. 154(b) by 419 days.

(21) Appl. No.: 18/272,200

(22) PCT Filed: Oct. 21, 2021

(86) PCT No.: PCT/JP2021/039006
§ 371 (c)(1),
(2) Date: Jul. 13, 2023

(87) PCT Pub. No.: WO2022/163042
PCT Pub. Date: Aug. 4, 2022

(65) Prior Publication Data

US 2024/0087841 A1 Mar. 14, 2024

(30) Foreign Application Priority Data

Jan. 29, 2021 (JP) ................................ 2021-012693

(51) Int. Cl.
*H01J 37/20* (2006.01)
*H01J 37/22* (2006.01)

(52) U.S. Cl.
CPC ............ *H01J 37/20* (2013.01); *H01J 37/226* (2013.01); *H01J 2237/202* (2013.01); *H01J 2237/24578* (2013.01)

(58) Field of Classification Search
CPC .... H01J 37/20; H01J 37/226; H01J 2237/202; H01J 2237/24578; H01J 2237/208; H01J 37/28; H01J 37/22; H01J 2237/31745; G01N 1/28; G01N 1/32; G01N 23/2204; G01N 23/2202; G01N 23/225;
(Continued)

(56) References Cited

U.S. PATENT DOCUMENTS 5,225,683 A * 7/1993 Suzuki .................... H01J 37/20 250/442.11
10,658,147 B2 * 5/2020 Sato .................... H01J 37/3023
10,692,688 B2 * 6/2020 Tomimatsu ............. H01J 37/20
(Continued)

FOREIGN PATENT DOCUMENTS

EP 2991096 B1 * 7/2017 ............. H01J 37/20
JP 2001141620 A 5/2001
(Continued)

*Primary Examiner* — David A Vanore
(74) *Attorney, Agent, or Firm* — Holland & Hart LLP

(57) ABSTRACT

This sample piece relocating device (10) includes an optical interferometry device (11), a sample piece carrying device (13), and a control device (21). The control device (21) controls the sample piece carrying device (13) based on information relating to processing in which a charged-particle beam device is used to irradiate a sample (S) with a charged-particle beam, thereby preparing a sample piece. The sample piece carrying device (13) controlled by the control device (21) separates and extracts the sample piece from the sample (S) and holds and carries the sample piece to a sample piece holder.

3 Claims, 9 Drawing Sheets

(58) Field of Classification Search
CPC ....... G01N 2223/307; G01N 2223/321; G01N 2223/33; G01N 2223/6116; H01L 22/00
See application file for complete search history.

(56) References Cited

U.S. PATENT DOCUMENTS

| | | | | |
|---|---|---|---|---|
| 2002/0166976 | A1* | 11/2002 | Sugaya | H01J 37/20 250/440.11 |
| 2004/0178372 | A1* | 9/2004 | Rasmussen | H01J 37/20 250/559.22 |
| 2006/0118733 | A1* | 6/2006 | Kiyohara | G01N 23/225 250/491.1 |
| 2006/0219919 | A1* | 10/2006 | Moore | H01J 37/26 250/311 |
| 2010/0282956 | A1* | 11/2010 | Kimba | G01N 23/00 250/252.1 |
| 2013/0082176 | A1* | 4/2013 | Yamamoto | H01J 37/222 250/310 |
| 2014/0291511 | A1* | 10/2014 | Man | H01J 37/3002 250/307 |
| 2015/0060695 | A1* | 3/2015 | Man | H01J 37/252 250/442.11 |
| 2015/0228451 | A1* | 8/2015 | Uemoto | H01J 37/261 250/310 |
| 2018/0204704 | A1* | 7/2018 | Suzuki | H01J 37/20 |
| 2019/0279843 | A1* | 9/2019 | Man | H01J 37/28 |
| 2019/0304745 | A1* | 10/2019 | Suzuki | H01J 37/3056 |
| 2021/0090850 | A1* | 3/2021 | Muraki | H01J 37/304 |
| 2021/0090853 | A1* | 3/2021 | Aso | H01J 37/222 |
| 2023/0090602 | A1* | 3/2023 | Hatano | B25H 1/0042 269/289 R |
| 2024/0087841 | A1* | 3/2024 | Asahata | H01L 22/00 |

FOREIGN PATENT DOCUMENTS

| | | | | | |
|---|---|---|---|---|---|
| JP | 2006084484 | A | | 3/2006 | |
| JP | 2009014734 | A | | 1/2009 | |
| JP | 2009216534 | A | * | 9/2009 | |
| JP | 2010-10146 | A | | 1/2010 | |
| JP | 2010010146 | A | | 1/2010 | |
| JP | 2014-225428 | | | 12/2014 | |
| JP | 2017174503 | A | * | 9/2017 | H01J 37/26 |
| JP | 2018116860 | A | * | 7/2018 | H01J 37/3023 |
| JP | 2020064780 | A | * | 4/2020 | H01J 37/12 |
| JP | 6931214 | B2 | * | 9/2021 | G03F 7/70758 |
| WO | WO-0179810 | A1 | * | 10/2001 | G01N 1/04 |
| WO | WO-2025141845 | A1 | * | 7/2025 | G01N 1/28 |

* cited by examiner

SAMPLE PIECE RELOCATING DEVICE

TECHNICAL FIELD

The present invention relates to a sample piece relocating device. This application for patent is a 371 national phase filing of Patent Application No. PCT/JP2021/039006 filed Oct. 21, 2021, which claims priority based on Japanese Patent Application No. 2021-012693 filed in Japan on Jan. 29, 2021, and uses the content here.

BACKGROUND ART

Conventionally, a device for preparing a sample piece for observation using a transmission electron microscope by irradiating a wafer-shaped sample with a charged-particle beam of electrons or ions, extracting the sample piece from the sample using a probe attached to a manipulator, and mounting the sample piece on a mesh is known (for example, refer to Patent Document 1).

RELATED ART (Patent Document 1) Japanese Patent Application Publication No. 2001-141620

DISCLOSURE

Technical Problem

In the device according to the related art, when relocating a minute sample piece from a sample onto a mesh, it is required to perform a prescribed relocating operation with high accuracy while preventing damage to the sample piece.

The present disclosure has been made keeping in mind the above circumstances. An objective of the present disclosure is to provide a sample piece relocating device capable of performing a prescribed relocating operation with high accuracy while preventing damage to a sample piece.

Technical Solution

In order to achieve the objective of the present disclosure, there is provided a sample piece relocating device, including: a sample piece carrying mechanism configured to carry a sample piece from a sample on which the sample piece is formed to a sample piece holder, and a control device configured to control the sample piece carrying mechanism based on information relating to processing to prepare the sample piece by irradiating the sample with a charged-particle beam using a charged-particle beam device, wherein the sample piece carrying mechanism controlled by the control device may separate and extract the sample piece from the sample, and hold the sample piece to carry the sample piece to the sample piece holder.

The above configuration may further include: a stage configured to maintain each of the sample on which the sample piece is formed and the sample piece holder, a stage driving mechanism configured to move the stage; optics configured to split predetermined light emitted from a light source to irradiate an observation target and a reference surface and synthesize a reflected light from the observation target and a reflected light from the reference surface to form an image of synthesized light representing a state of the two reflected lights; an image capture device configured to output a signal of an image obtained by capturing the formed by the optics; and an optics driving mechanism configured to move the optics relative to the stage to change a distance between the optics and the stage, wherein the control device may control the sample piece carrying mechanism, the stage driving mechanism, and the optics driving mechanism based on the information relating to processing and the state of interference detected in the image outputted by the image capture device.

In the above configuration, the control device may detect a position of the observation target based on coordinate data representing a position of the optics in real space when an intensity or contrast of interference fringes detected in the image is maximized while moving the optics by means of the optics driving mechanism.

In the above configuration, the control device may detect the position of the observation target based on distribution of the interference fringes.

In the above configuration, the control device may determine that a sample piece holding portion of the sample piece carrying mechanism or the sample piece held by the sample piece holding portion has come into contact with the observation target when deformation occurs in the interference fringes detected in the image outputted by the image capture device when the sample piece carrying mechanism is operated.

The above configuration may further include: a first image capture device that is the image capture device that captures the image formed by the optics; and a second image capture device that outputs the signal of the image obtained by capturing an image of the observation target, wherein the control device may detect a position of the observation target based on positional information of a fiducial mark detected in the image outputted by the second image capture device.

Advantageous Effects

According to the present disclosure, by providing a control device that controls a sample piece carrying device based on information relating to processing to prepare a sample piece, it is possible to perform a prescribed relocating operation with high accuracy while preventing damage to the sample piece.

MODE FOR INVENTION

Hereinafter, a sample piece relocating device 10 for automatically relocating a sample piece Q according to an embodiment of the present disclosure will be described with reference to the accompanying drawings.

Figure 1:
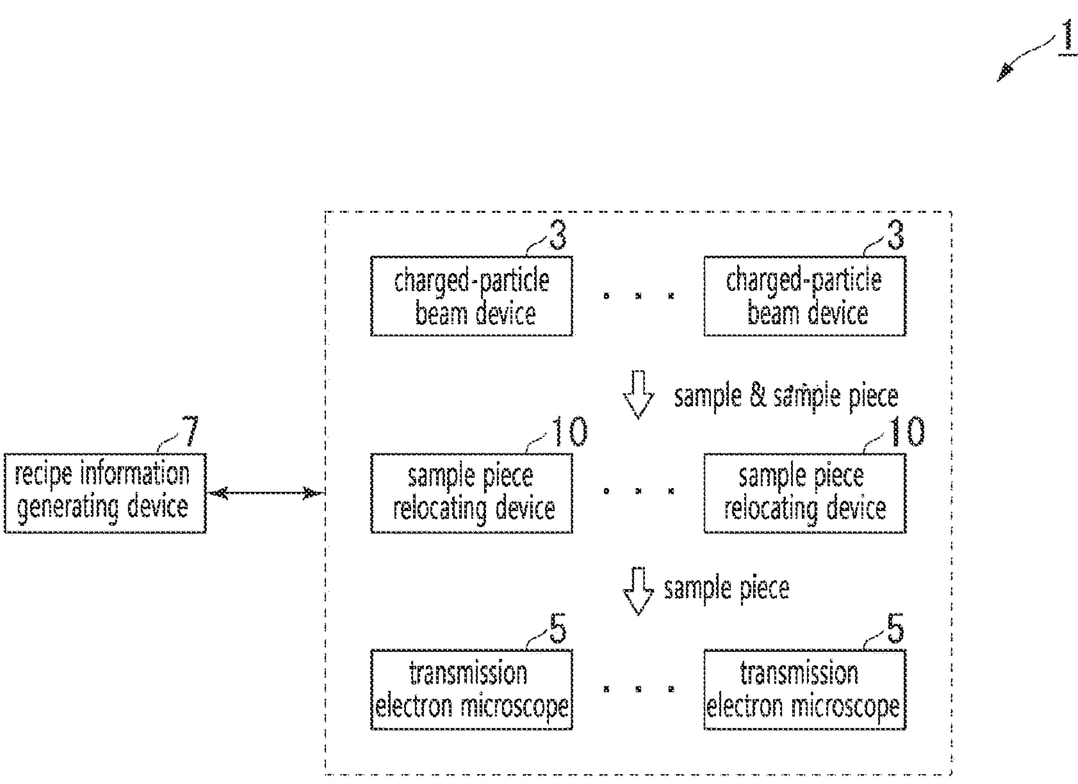
FIG. 1 is a configuration view of a thin piece sample observation system provided with a sample piece relocating device according to an embodiment of the present disclosure.

FIG. 1 is a configuration view of a thin piece sample observation system 1 provided with the sample piece relocating device 10 according to the embodiment of the present disclosure.

As shown in FIG. 1, the sample piece relocating device 10 according to the embodiment is provided in, for example, the thin piece sample observation system 1. The thin piece sample observation system 1 includes a plurality of charged-particle beam devices 3, a plurality of transmission electron microscopes 5, a recipe information generating device 7, and a plurality of sample piece relocating devices 10.

The charged-particle beam device 3 performs processing to form, for example, the sample piece Q of a desired thickness suitable for transmission observation by the transmission electron microscope 5 from a wafer-shaped sample (sample substrate, etc.) S made of a semiconductor such as silicon. The charged-particle beam device 3 may include focused ion beam irradiation optics for irradiating a radiation target with a focused ion beam, electron beam irradiation optics for irradiating the radiation target with an electron beam, and a gas supply unit for supplying etching gas or deposition gas to the radiation target. The charged-particle beam device 3 performs imaging of irradiated areas, a variety of sputtering processes (e.g., excavation and trimming, etc.), and formation of a deposition film, and the like by scanning and irradiating the surface of the radiation target with the focused ion beam.

The charged-particle beam device 3 obtains an observation image of the surface of the radiation target by scanning and irradiating the surface of the radiation target with the focused ion beam or the electron beam. The image of the radiation target is, for example, a scanning ion microscopy (SIM) image, a scanning electron microscopy (SEM) image, or an absorption current image. The SIM image or SEM image is an image based on secondary charged-particles (e.g., secondary electrons or secondary ions) generated from the radiation target by irradiation with the focused ion beam or electron beam. The absorption current image is an image based on an incoming current of a charged-particle beam flowing into the radiation target (or an absorption current of a charged-particle beam absorbed by the radiation target).

The etching gas selectively promotes the etching of the radiation target by the focused ion beam according to the material of the radiation target. The deposition gas forms a deposition film made of deposits such as metal or insulator on the surface of the radiation target. The deposition film is formed as solid components decomposed by the deposition gas supplied from the gas supply unit are deposited on the surface of the radiation target, in addition to the charged-particle beam irradiation.

Figure 2:
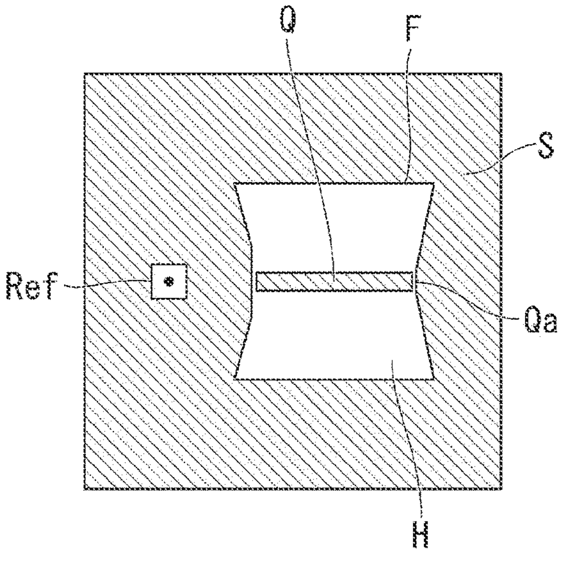
FIG. 2 is a plan view showing a sample and a sample piece in the sample piece relocating device according to the embodiment of the present disclosure.

FIG. 2 is a plan view showing the sample S and the sample piece Q in the sample piece relocating device 10 according to the embodiment of the present disclosure.

As shown in FIG. 2, the charged-particle beam device 3 irradiates the surface (shaded part) of the sample S with the focused ion beam to form the sample piece Q (sample piece Q before being extracted from the sample S). The charged-particle beam device 3 excavates a processing region H (white part) inside a processing edge F representing a scanning range of the focused ion beam by sputter processing by irradiation with the focused ion beam. The charged-particle beam device 3 forms the sample piece Q based on a reference mark (reference point) Ref indicating a position at which the sample piece Q is to be formed (i.e., a position left without excavation). The reference mark Ref is, for example, a deposition film having a predetermined shape in which micro holes are formed by irradiation with the focused ion beam. The charged-particle beam device 3 may grasp the approximate position of the sample piece Q by using the deposition film of the reference mark Ref, and perform precise positioning of the sample piece Q by using the micro holes of the reference mark Ref.

The sample piece Q may be etched so that sides and the lower periphery thereof are shaved off and removed leaving a support part Qa connected to the sample S. The sample piece Q is cantilever-supported on the sample S by the support part Qa. A cut notch with an appropriate depth is formed in the support part Qa, so that the sample piece Q is easily separated from the sample S.

The sample S on which the sample piece Q is formed is accommodated in, for example, a transport and storage container such as a front-opening integrated pod, and transported from the charged-particle beam device 3 to the sample piece relocating device 10.

The transmission electron microscope 5 performs transmission observation of the sample piece Q transferred from the sample piece relocating device 10 together with a sample piece holder P.

Figure 3:
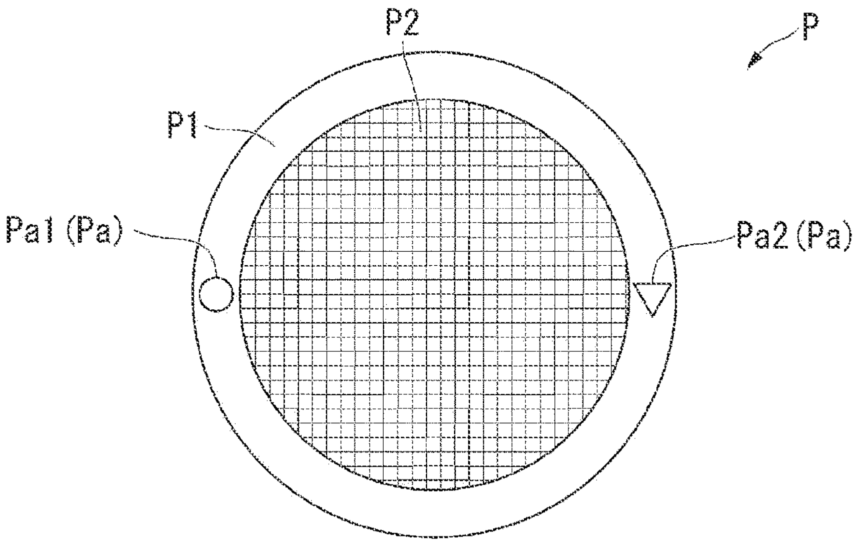
FIG. 3 is a plan view showing a sample piece holder in the sample piece relocating device according to the embodiment of the present disclosure.

FIG. 3 is a plan view showing the sample piece holder P in the sample piece relocating device 10 according to the embodiment of the present disclosure.

As shown in FIG. 3, the sample piece holder P may include an annular-plate shaped grid frame P1 and a mesh P2 provided inside the grid frame P1. The sample piece holder P may also include a support film (not shown) provided on the mesh P2. In the sample piece holder P, a fiducial mark Pa (first fiducial mark Pa1 and second fiducial mark Pa2, etc.) indicated by a through hole or the like of an appropriate shape may be provided.

The sample piece holder P holding the sample piece Q may be accommodated in an appropriate container and transferred from the sample piece relocating device 10 to the transmission electron microscope 5.

The recipe information generating device 7 may create and store recipe information including information on preparation of the sample piece Q by the charged-particle beam device 3 (processing recipe), information on transmission observation of the sample piece Q using the transmission electron microscope 5 (observation recipe), and information on relocation of the sample piece Q by the sample piece relocating device 10 (relocation recipe).

The processing recipe includes information such as the process and conditions for preparing the sample piece Q from the sample S. For example, the processing recipe includes information on the position of the sample piece Q based on the coordinates of various processing positions of the charged-particle beam device 3, such as the relative position of the reference mark Ref and the sample piece Q on the sample S, and information on the dimensions of the sample piece Q, such as the depth of the processing region H where the sample piece Q is formed.

The relocation recipe includes information such as the process and conditions for relocating the sample piece Q from the sample S to the sample piece holder P. For example, the relocation recipe includes identification information of the container accommodating the sample S, identification information of the sample S, information on whether or not the preparation of the sample piece Q is successful, information on the relative relationship of stage coordinates between the charged-particle beam device 3 and the sample piece relocating device 10, information on the relative relationship of coordinates between a stage 31*a* of a sample stand 31, which will be described later, and a pair of arms 81*a* of tweezers 81 of a sample piece carrying device 13, information on the position and dimensions of the sample piece Q in the processing recipe, identification information of the sample piece holder P, and information of the mounting position of the sample piece Q in the sample piece holder P.

The observation recipe includes information such as the process and conditions of transmission observation of the sample piece Q. For example, the observation recipe includes identification information of the container accommodating the sample piece holder P identification information of the sample piece holder P, posture information such as the mounting position and front/back of the sample piece Q in the sample piece holder P and information on the relative relationship of stage coordinates between the transmission electron microscope 5 and the sample piece relocating device 10.

The recipe information generating device 7 may store image data obtained from each of the charged-particle beam device 3 and the sample piece relocating device 10 together with the recipe information.

The image data obtained from the charged-particle beam device 3 is, for example, an observation image (i.e., a SIM image or a SEM image) obtained by scanning and irradiating an appropriate area including the sample S with a focused ion beam or an electron beam after completion of the preparation of the sample piece Q from the sample S. The image data obtained from the sample piece relocating device 10 is, for example, a microscopic image of the sample piece Q mounted on the sample piece holder P.

Figure 4:
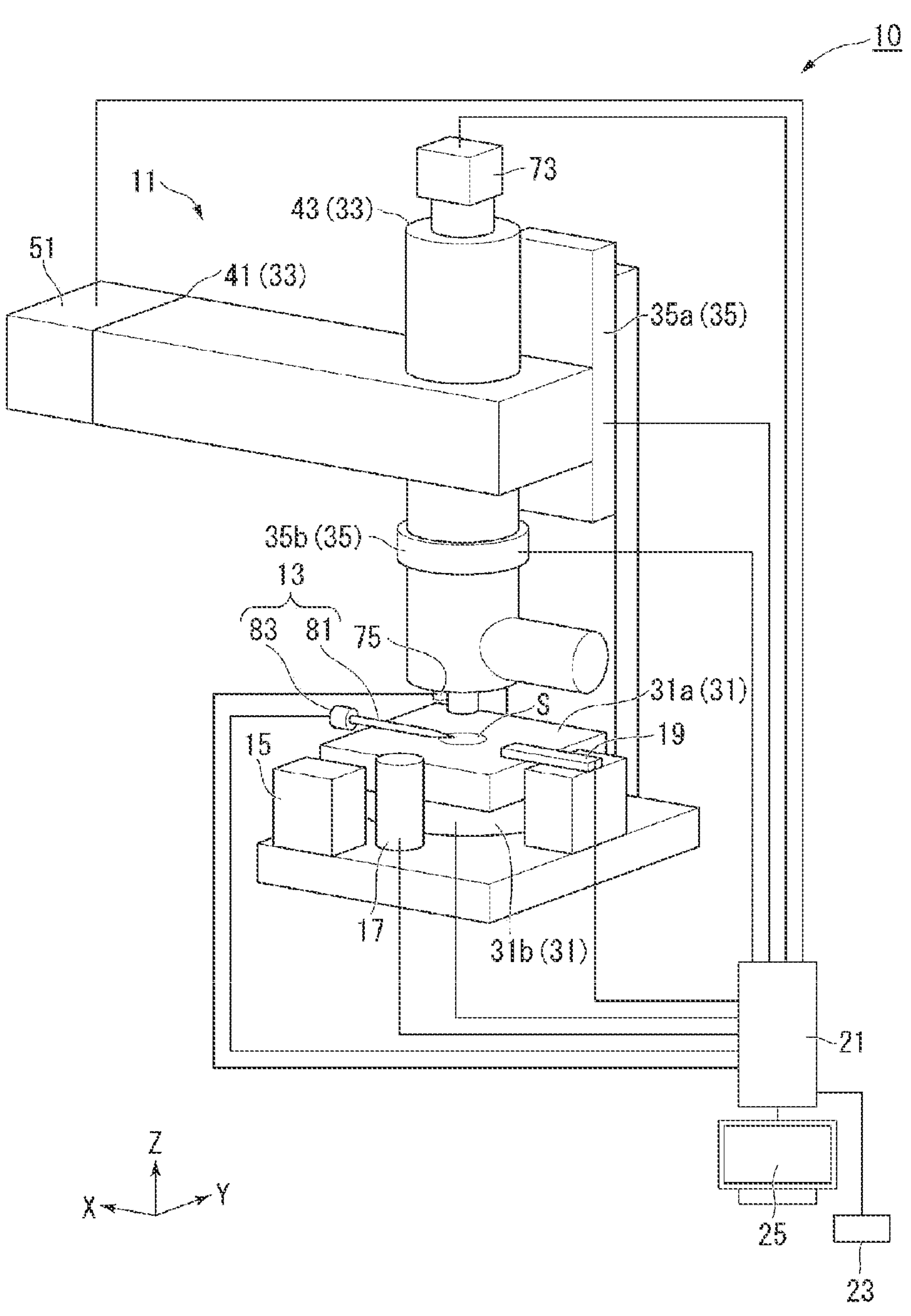
FIG. 4 is a configuration view of the sample piece relocating device according to the embodiment of the present disclosure.
Figure 5:
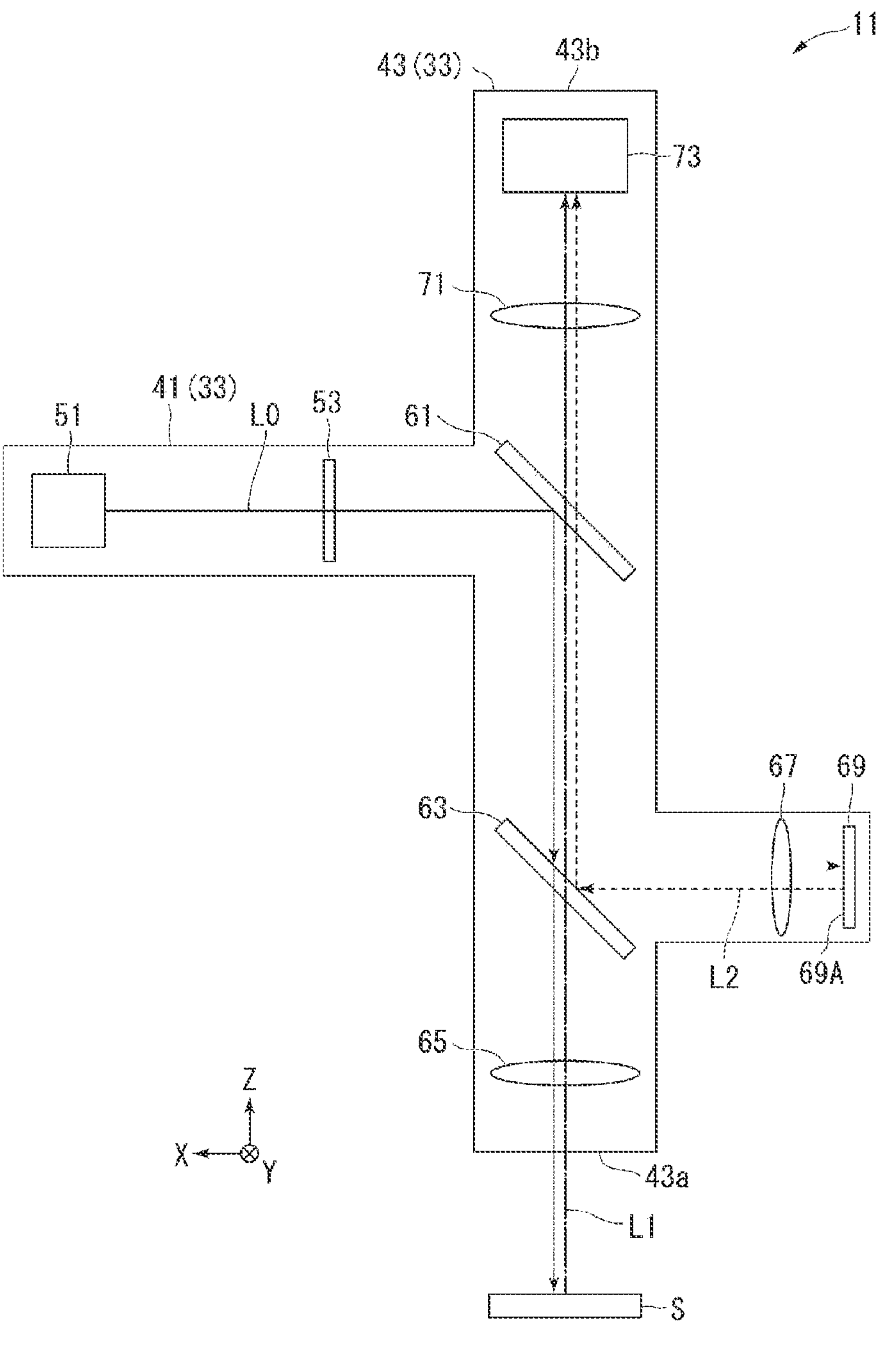
FIG. 5 is a view schematically showing the configuration of an optical interferometry device according to the embodiment of the present disclosure.

FIG. 4 is a configuration view of the sample piece relocating device 10 according to the embodiment of the present disclosure. FIG. 5 is a view schematically showing the configuration of an optical interferometry device 11 according to the embodiment of the present disclosure.

As shown in FIG. 4, the sample piece relocating device 10 may include the optical interferometry device 11, the sample piece carrying device 13, a load port 15, a sample carrying device 17, and a sample piece holder carrying device 19. The sample piece relocating device 10 includes a control device 21 that integrally controls the operation of the sample piece relocating device 10, and an input device 23 and a display device 25 connected to control device 21.

In addition, in the following, each axis direction of the X-axis, Y-axis, and Z-axis orthogonal to each other in the three-dimensional space is a direction parallel to each axis. For example, the Z-axis direction is parallel to the vertical direction (e.g., direction perpendicular to the earth's surface) of the sample piece relocating device 10. The X-axis direction and the Y-axis direction are parallel to a reference plane (for example, a horizontal plane, etc.) orthogonal to the vertical direction of the sample piece relocating device 10.

The optical interferometry device 11 is, for example, a Linnik white light interferometer. The optical interferometry device 11 may include the sample stand 31, a column 33, and a column driving mechanism 35.

The sample stand 31 includes the stage 31*a* supporting the sample S. and a stage driving mechanism 31*b* for two-dimensionally translating and rotating the stage 31*a*.

The stage driving mechanism 31*b* may translate the stage 31*a* along each axial direction of the X axis and the Y axis. In addition, the stage driving mechanism 31*b* may include mechanism for translating the stage 31*a* along the axial direction of the Z axis. The stage driving mechanism 31*b* may rotate the stage 31*a* at an appropriate angle around each axis of a predetermined rotational axis and tilting axis. The rotational axis is set relative to the stage 31*a*, and is parallel to the vertical direction of the sample piece relocating device 10 when the stage 31*a* is at a predetermined reference position around the axis of the tilting axis. The tilting axis is parallel to the direction orthogonal to the vertical direction of the sample piece relocating device 10. The stage driving mechanism 31*b* is controlled by a control signal output from the control device 21 according to the operation mode of the sample piece relocating device 10 and the like.

As shown in FIGS. 4 and 5, the column 33 may include a light source column 41 and an observation column 43 orthogonal to each other and integrally connected. For example, the light source column 41 extends along the X-axis direction, and the observation column 43 extends along the Z-axis direction.

The light source column 41 may include alight source 51 and a filter 53. The light source 51 is, for example, a white light source. The filter 53 is, for example, a wavelength filter such as a band-pass filter and polarization filter, etc.

The observation column 43 may include a first beam splitter 61 and a second beam splitter 63, a first objective lens 65 and a second objective lens 67, a reflector 69, an imaging lens 71, an observation camera 73, and a position adjustment camera 75.

The first beam splitter 61 may be disposed at a connection portion of the light source column 41 and the observation column 43, such as a position where the mutual central axes of the light source column 41 and the observation column 43 intersect. The first beam splitter 61 reflects an irradiation light L0 traveling from the light source 51 through the filter 53 toward a first end 43*a* on the observation target side among both ends of the observation column 43 (i.e., toward the first objective lens 65 to be described later).

The first beam splitter 61 propagates reflected lights L1 and L2 (synthesized light) from the second beam splitter 63 described later to a second end 43_b_ on the side of the observation camera 73 among both ends of the observation column 43.

The second beam splitter 63 is disposed between the first beam splitter 61 and the first objective lens 65. The second beam splitter 63 separates the irradiation light L0 from the first beam splitter 61 into a first direction along the central axis of the observation column 43 and a second direction orthogonal to the central axis of the observation column 43. The first direction is, for example, the Z-axis direction, and is a direction toward the first objective lens 65 described later. The second direction is, for example, the X-axis direction, and is a direction toward the second objective lens 67 described later.

The second beam splitter 63 propagates the synthesized light obtained by overlapping the reflected light L1 from an observation target to be described later and the reflected light L2 from the reflector 69 toward the second end 43_b_ of the observation column 43. The state of interference of the synthesized light changes depending on the optical path difference between the reflected light L1 from the observation target and the reflected light L2 from the reflector 69.

The first objective lens 65 is disposed at the first end 43_a_ of the observation column 43. The first objective lens 65 focuses the irradiation light L0 that travels (transmits) along the first direction from the second beam splitter 63 on an observation target (e.g., the sample S, the sample piece Q. and the pair of arms Sla of the tweezers 81 to be described later, etc.).

The second objective lens 67 is disposed to be appropriately spaced apart from the second beam splitter 63 along the second direction. The second objective lens 67 focuses the irradiation light L0 traveling (reflected) along the second direction from the second beam splitter 63 onto the reflector 69.

The reflector 69 is disposed to be appropriately spaced apart from the second objective lens 67 along the second direction. The reflector 69 has a reference surface 69A of a surface formed smoothly with a predetermined accuracy. The reflector 69 reflects the irradiation light L0 from the second objective lens 67 toward the second beam splitter 63 by means of the reference surface 69A.

The imaging lens 71 is disposed between the first beam splitter 61 and the observation camera 73. The imaging lens 71 obtains an image of an interference fringe by imaging the synthesized light from the first beam splitter 61.

The observation camera 73 is disposed at the second end 43_b_ of the observation column 43. The observation camera 73 captures an image of the interference fringes of synthesized light formed by the imaging lens 71, and outputs a signal of an image (microscopic image) obtained by the capturing.

The position adjustment camera 75 may capture images of the sample S, the sample piece holder P etc. placed on the stage 31_a_, and outputs a signal of an image obtained by capturing.

The column driving mechanism 35 changes the distance in the Z-axis direction between the sample stand 31 and the column 33 (i.e., the relative position of the first objective lens 65 in the Z-axis direction with respect to the observation target) by, for example, translating the column 33 along the Z-axis axial direction. The column driving mechanism 35 may include a motor 35_a_ for rough adjustment and a piezo actuator 35_b_ for fine adjustment.

The optical interferometry device 11 acquires information on the position and three-dimensional shape of the observation target in real space by means of two-beam interference by white light. The optical path difference between the reflected light L1 from the observation target synthesized in the second beam splitter 63 and the reflected light L2 from the reflector 69 changes the state of interference of the synthesized light obtained by synthesizing the two beams of reflected light L1 and L2. The synthesized light generates interference fringes of light and dark that strengthen (brighten) when the phases of the reflected light L1 from the observation target and the reflected light L2 from the reflector 69 coincide, and weaken (darken) when the phases of the reflected light L1 and the reflected light L2 do not match. Since the reference surface 69A of the reflector 69 is formed smoothly, the interference hinges represent information of a three-dimensional shape such as irregularities on the surface of the observation target. The distribution of the interference fringes (e.g., the number of interference fringes) corresponds to the height difference of the surface of the observation target because the interval of the interference fringes shows a constant optical path difference depending on the wavelength of the irradiation light L0 from the light source 51.

In the optical interferometry device 11, while the relative positions of the second objective lens 67 and the reflector 69 are fixed, the relative positions of the first objective lens 65 and the observation target change by the operation of the column driving mechanism 35. A focus position (i.e., a position where the intensity or contrast of interference fringes observed on a microscope is maximized) in the observation target is adjusted as the first objective lens 65 is displaced in the Z-axis direction by the operation of the column driving mechanism 35. The position (Z position) of the focus position of the observation target in the Z-axis direction is correlated with coordinate data (Z-axis coordinate) representing the position of the first objective lens 65 (or column 33) in real space.

The sample piece carrying device 13 may include the tweezers 81 which are a sample piece holding portion and a tweezer driving mechanism 83. The tweezers 81 pinch and grip the sample piece Q from both sides thereof in the thickness direction with the pair of arms 81_a_. The pair of arms 81_a_ of the tweezers 81 extract the sample piece Q from the sample S and relocate the sample piece Q to the sample piece holder P. In addition, the sample piece holding portion is not limited to the tweezers 81, and may be, for example, a glass or metal probe. For example, the probe adsorbs the sample piece Q by electrostatic force or the like.

The tweezer driving mechanism 83 three-dimensionally displaces the tweezers 81 with respect to the stage 31_a_ of the optical interferometry device 11 and opens and closes the pair of arms 81_a_. The tweezer driving mechanism 83 may translate the pair of arms 81_a_ of the tweezers 81 in the X-axis, Y-axis, and Z-axis directions in a state where the pair of arms 81_a_ are inclined with respect to the surface of the stage 31_a_ at a predetermined angle range. The tweezer driving mechanism 83 may rotate the pair of arms 81_a_ of the tweezers 81 around the axis of an appropriate rotation shaft.

The load port 15 may support a container for accommodating the sample S, such as a front-opening integrated pod, and expose the sample S inside the container by opening the cover of the container.

The sample carrying device 17 is, for example, a robot for carrying the sample S. The sample carrying device 17 carries the sample S between the container supported by the load port 15 and a predetermined position (e.g., the central position crossing the axis of the central axis of the observation column 43, etc.) on the stage 31_a_. The sample carrying device 17 takes out the sample S from the container supported by the load port 15 and places the sample S at the predetermined position on the stage 31*a*.

The sample piece holder carrying device 19 is, for example, a robot for carrying the sample piece holder P. The sample piece holder carrying device 19 carries the sample piece holder P between a transport container disposed on a support portion (not shown) and a predetermined position on the stage 31*a*. The sample piece holder carrying device 19 takes out the sample piece holder P from the transport container disposed on the support portion and places the sample piece holder P at the predetermined position on the stage 31*a*.

The control device 21 may integrally control the operation of the sample piece relocating device 10 by a signal output from the input device 23 or a signal generated by a preset automatic operation control process.

The control device 21 is, for example, a software functional unit that functions by executing a predetermined program by a processor such as a central processing unit (CPU). The software functional unit is an electronic control unit (ECU) having electronic circuits including a processor such as a CPU, a read-only memory (ROM) for storing programs, a random access memory (RAM) for temporarily storing data, and a timer. At least part of the control device 21 may be an integrated circuit such as large scale integration (LSI).

The control device 21 relocates the sample piece Q from the sample S to the sample piece holder P based on the recipe information (e.g., a recipe for relocation based on a recipe for processing, etc.) acquired from the recipe information generating device 7. The control device 21 may transmit information such as the mounting position and posture of the sample piece Q in the sample piece holder P to the recipe information generating device 7 so as to be newly added to the recipe information.

The input device 23 is, for example, a mouse and a keyboard that output signals according to an operator's input operation.

The display device 25 displays various types of information of the sample piece relocating device 10, image data generated by, signals output from the cameras 73 and 75, and screen for performing operations such as enlarging, reducing, moving, and rotating image data.

The sample piece relocating device 10 according to the embodiment of the present disclosure has the above-described configurations. Next, the operation of the sample piece relocating device 10, that is, the operation of automatically relocating the sample piece Q made by processing the sample S with the charged-particle beam (focused ion beam) of the charged-particle beam device 3 to the sample piece holder P will be described.

Figure 6:
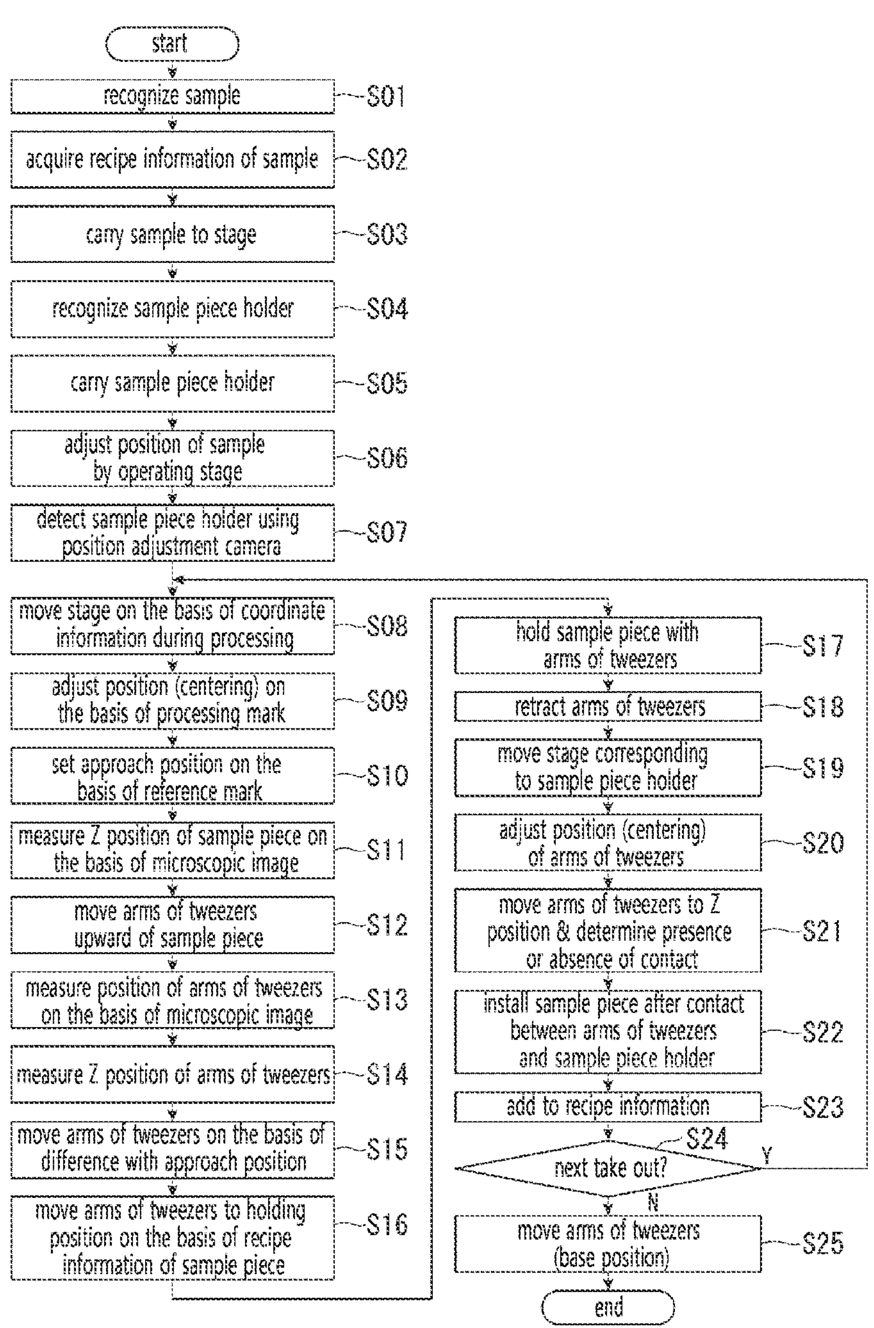
FIG. 6 is a flowchart showing the operation of the sample piece relocating device according to the embodiment of the present disclosure.

FIG. 6 is a flowchart showing the operation of the sample piece relocating device 10 according to the embodiment of the present disclosure.

As shown in FIG. 6, first, the control device 21 recognizes a desired sample S based on the identification information of the container supported by the load port 15 and the position of each of one or more samples S accommodated in the container (step S01).

Next, the control device 21 acquires recipe information corresponding to the recognized sample S from the recipe information generating device 7 (step S02).

Next, the control device 21 takes out the sample S from the container of the load port 15 by means of the sample carrying device 17 and places the taken-out sample S at a predetermined position on the stage 31*a* (step S03).

Next, the control device 21 reads the identification information of each of the container disposed in the support portion of the sample piece holder carrying device 19 and the sample piece holder P accommodated in the container in order to acquire information such as the shape and fiducial mark Pa of the sample piece holder P (step S04).

Next, the control device 21 takes out the sample piece holder P from the container of the support portion by means of the sample piece holder carrying device 19 and installs the taken-out sample piece holder P in a predetermined position on the stage 31*a* (step S05).

Next, the control device 21 acquires a signal of an image obtained by imaging the sample S placed on the stage 31*a* from the position adjustment camera 75. The control device 21 detects the position of a notch (not shown) for positioning with respect to the crystal orientation presented in the sample S from the captured image of the sample S, and detects the offset amount and rotation angle of the sample S for a predetermined posture based on the position of the notch. The control device 21 operates the stage 31*a* by means of the stage driving mechanism 31*b* to correct the detected offset amount and rotation angle of the sample S and set the sample S to a predetermined posture (step S06). At this time, the alignment mark of the sample S may be detected using the position adjustment camera 75, and the sample S may be set to a predetermined posture based on the detection result.

Next, the control device 21 acquires a signal of an image obtained by imaging the sample piece holder P installed on the stage 31*a* from the position adjustment camera 75. The control device 21 detects the position of the fiducial mark Pa formed on the sample piece holder P from the captured image of the sample piece holder P, and detects the rotation angle of the sample piece holder P for a predetermined posture. The control device 21 correlates the mounting position of the sample piece Q in the sample piece holder P with the coordinate information of the stage 31*a* based on the detected position of the fiducial mark Pa (step S07).

Next, based on the coordinates of various processing positions of the charged-particle beam device 3 in the processing recipe, the control device 21 operates the stage 31*a* by means of the stage driving mechanism 31*b* so that the position of the target sample piece Q is placed in the field of view of the observation camera 73 and aligned with a predetermined lift-out position (step S08). For example, the control device 21 may specify the charged-particle beam device 3 used for preparing the desired sample piece Q based on the processing recipe, and may set a parameter for correcting the correspondence of the stage coordinates of the specified charged-particle beam device 3 and the sample piece relocating device 10 to each other.

Next, the control device 21 acquires, from the observation camera 73, a signal of a microscopic image of a processing mark formed on the sample S by the charged-particle beam device 3. The processing mark of the sample S is, for example, a region including the inner side of the processing edge F and the reference mark Ref in the sample S (see FIG. 2). Based on the image data (e.g., SIM image or SEM image) of the processing mark of the sample S acquired from the recipe information generating device 7 and the microscopic image acquired from the observation camera 73, the control device 21 operates the stage 31*a* by means of the stage driving mechanism 31*b* so that the processing mark of the sample S coincides with the center of field of view of the field of view of the observation camera 73 (step S09). For example, the control device 21 matches the processing mark of the sample S to the center of field of view by using the image data acquired from the recipe information generating device 7 as a template (reference image data) and performing template matching (overlapping the template and the microscopic image, etc.) on the microscopic image acquired from the observation camera 73.

Next, based on the microscopic image of processing mark of the sample S, the control device 21 recognizes the position of the sample piece Q from the relative positional relationship between the reference mark Ref and the sample piece Q already known from the recipe information. The control device 21 sets an approach position of the pair of arms 81*a* of the tweezers 81 according to the recognized position of the sample piece Q (step S10). The approach position of the pair of arms 81*a* is, for example, a target position of the front ends of the pair of arms 81*a* specified by the X-axis coordinate and the Y-axis coordinate, and a position at which the front ends of the pair of arms 81*a* start to approach the sample piece Q in the Z-axis direction.

Next, the control device 21 measures (step S11) the position (Z position) of the sample piece Q in the Z-axis direction based on the signal of the microscopic image output from the observation camera 73, while moving the column 33 in the Z-axis direction by means of the column driving mechanism 35. For example, the control device 21 grasps the Z position of the sample piece Q based on the Z-axis coordinates of the column 33 when focusing on the surface of the sample piece Q (i.e., when the intensity or contrast of the interference fringes observed on the microscope is maximized, etc.).

Figure 7:
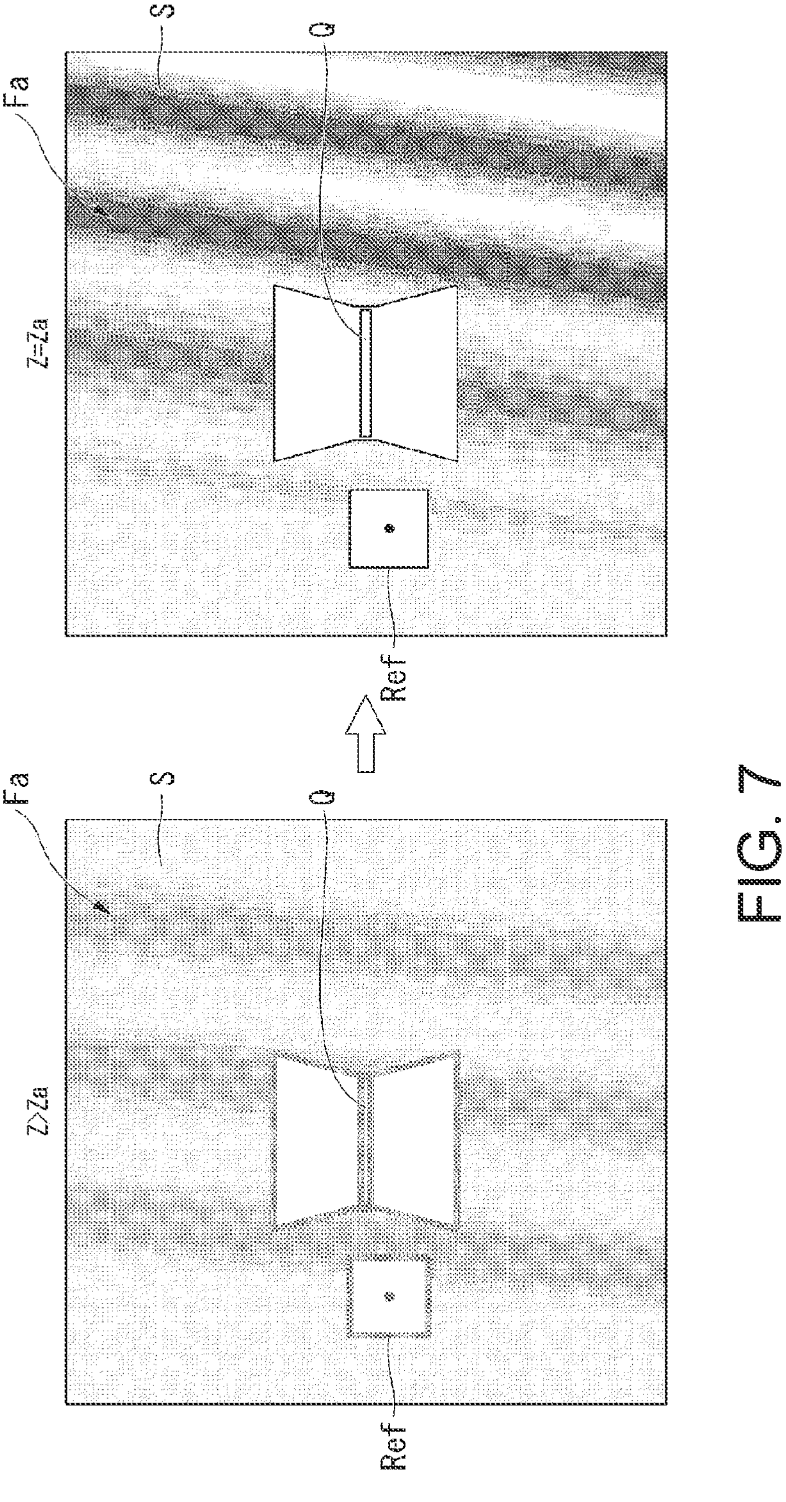
FIG. 7 is a view showing an example of a focused state and an interference fringe in a microscopic image of the sample and the sample piece of the sample piece relocating device according to the embodiment of the present disclosure.

FIG. 7 is a view showing an example of a focused state and an interference fringe Fa in a microscopic image of the sample S and the sample piece Q of the sample piece relocating device 10 according to the embodiment of the present disclosure.

As shown in FIG. 7, based on the movement of the column 33 in the Z-axis direction, the control device 21 causes a transition from a state m which the surfaces of the sample S and the sample piece Q are out of focus to a state in which the surfaces of the sample S and the sample piece Q are in focus. For example, the control device 21 grasps the Z position of the sample piece Q based on the Z-axis coordinate (=predetermined value Za) when the transition is made from a state in which the interference fringe Fa is not observed or the interference fringe Fa is not clear because the Z-axis coordinate of the column 33 is greater than the predetermined value Za to a state in which the interference fringe Fa is more clearly observed. In addition, the control device 21 may grasp the Z position of the sample piece Q in more detail from the number of interference fringes Fa observed on the surfaces of the sample S and the sample piece Q based on the dependence of the interval of the interference fringe Fa on the wavelength of irradiation light from the light source 51, and the distribution of the interference fringes Fa (e.g., the number of interference fringes Fa) corresponding to the height difference of the surface of the observation target.

Next, the control device 21 moves the front ends of the pair of arms 81*a* of the tweezers 81 upward in the Z-axis of the sample piece Q by means of the tweezer driving mechanism 83 according to the approach position set in step S10 described above (step S12).

Next, the control device 21 grasps the position of the front ends of the pair of arms 81*a* of the tweezers 81 based on the signal of the microscopic image output from the observation camera 73 (step S13). The position of the front ends of the pair of arms 81*a* is a position specified by X-axis coordinates and Y-axis coordinates, for example. The control device 21 may move the column 33 in the Z-axis direction by means of the column driving mechanism 35, and grasps the relative positional relationship with the center of field of view at the time of focusing (when the intensity or contrast of the interference fringes observed on the microscope is maximized, etc.) at the front ends of the pair of arms 81*a* from the X-axis coordinate and the Y-axis coordinate.

Next, the control device 21 measures (step S14) the position (Z position) of the front ends of the pair of arms 81*a* of the tweezers 81 in the Z-axis direction based on the signal of the microscopic image output from the observation camera 73, while moving the column 33 in the Z-axis direction by means of the column driving mechanism 35. For example, the control device 21 grasps the Z position of the front ends of the pair of arms 81*a* based on the interference fringes observed on the pair of arms 81*a* in a microscopic image.

Figure 8:
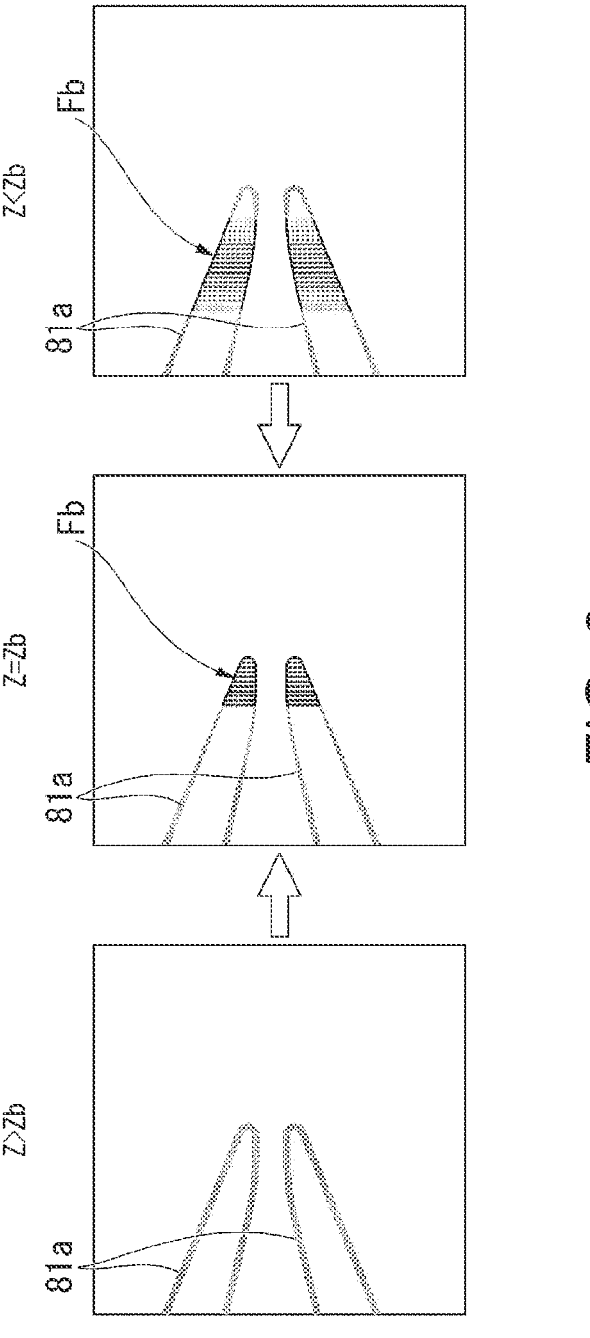
FIG. 8 is a view showing an example of a focused state and an interference fringe in a microscopic image of arms of tweezers in the sample piece relocating device according to the embodiment of the present disclosure.

FIG. 8 is a view showing an example of a focused state and an interference fringe Fb in a microscopic image of arms 81*a* of tweezers 81 in the sample piece relocating device 10 according to the embodiment of the present disclosure.

As shown in FIG. 8, based on the movement of the column 33 in the Z-axis direction, the control device 21 causes a transition from a state in which the surface of the front ends of the pair of arms 81*a* are out of focus to a state in which the surface of the front ends of the pair of arms 81*a* are in focus. For example, the control device 21 grasps the Z position of the front ends of the pair of arms 81*a* based on the Z-axis coordinate (=predetermined value Zb) when the transition is made from a state in which the interference fringe Fb is not observed or the interference fringe Fb is not clear because the Z-axis coordinate is greater than the predetermined value Zb or a state in which the interference fringe Fb is observed at areas other than the front ends of the pair of arms 81*a* (central portion, etc.) because the Z-axis coordinate is smaller than the predetermined value Zb to a state in which the interference fringe Fb is more clearly observed at the front ends of the pair of arms 81*a*. In addition, the control device 21 may grasp the Z position of the front ends of the pair of arms 81*a* in more detail according to the number of interference fringes Fb observed on the surface of the front ends of the pair of arms 81*a* based on the dependence of the interval of the interference fringe Fb on the wavelength of irradiation light from the light source 51, and the distribution of the interference fringes Fb (e.g., the number of interference fringes Fb) corresponding to the height difference of the surface of the observation target.

Furthermore, the control device 21 may grasp the Z position of the front ends of the pair of arms 81*a* in more detail based on the known shape and dimensions of the front ends of the pair of arms 81*a*.

Next, the control device 21 moves (step S15) the pair of arms 81*a* by means of the tweezer driving mechanism 83 so that the positions of the front ends of the pair of arms 81*a* and the approach position coincide (to eliminate the difference in position) based on the difference between the approach position set in step S10 described above and the positions of the front ends of the pair of arms 81*a* of the tweezers 81 determined in step S13 described above.

Next, the control device 21 moves (step S16) the pair of arms 81*a* to the holding position in the Z-axis direction by means of the tweezer driving mechanism 83 based on the Z position of the sample piece Q determined in step S11 described above, the Z position of the front ends of the pair of arms 81*a* of the tweezers 81 determined in step S14 described above, and the information on the shape and dimensions of the sample piece Q already known from recipe information, and the information on the shape and dimensions of the front ends of the pair of arms 81*a* already known by prior measurement, etc. The holding position is, for example, a position where the front ends of the pair of arms 81*a* come into contact with the sample piece Q and the sample piece Q can be held by the operation of the pair of arms 81*a* from opening to closing.

Figure 9:
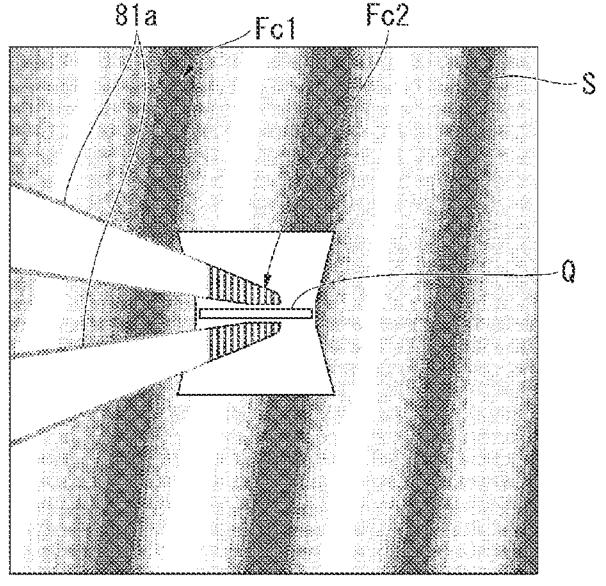
FIG. 9 is a view showing an example of a focused state and interference fringes in a microscopic image of the arms of the tweezers and the sample piece in the sample piece relocating device according to the embodiment of the present disclosure, a view showing a state in which the arms of the tweezers approach the sample piece.

FIG. 9 is a view showing an example of a focused state and interference fringes Fc1, Fc2 in a microscopic image of the arms 81*a* of the tweezers 81 in the sample piece relocating device 10 according to the embodiment of the present disclosure, a view showing a state in which the arms 81*a* approach the sample piece Q.

As shown in FIG. 9, the control device 21 gradually moves the pair of arms 81*a* of the tweezers 81, which are in the open state, in the Z-axis direction so as to cause a transition from a state in which the interference fringe Fc1 is observed by focusing on the surfaces of the sample S and the sample piece Q to a state in which the interference fringe Fc2 is observed at each of the front ends of the pair of arms 81*a*, and the sample piece Q can be held by the front ends of the pair of arms 81*a*.

In addition, the control device 21 may determine that the front ends of the pair of arms 81*a* have come into contact with the sample piece Q when deformation occurs in the interference fringe on the surface of the sample piece Q detected on the microscopic image output from the observation camera 73.

Next, the control device 21 holds the sample piece Q with the front ends of the pair of arms 81*a* of the tweezers 81, and separates the sample piece Q from the sample S (step S17). The control device 21 may check whether or not the sample piece Q is held by the front ends of the pair of arms 81*a* by using a predetermined image recognition process or the like for the microscopic image output from the observation camera 73.

Figure 10:
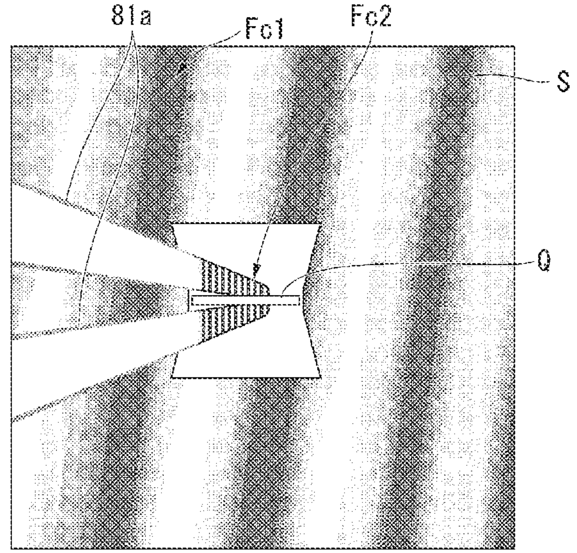
FIG. 10 is view showing an example of a focused state and interference fringes in a microscopic image of the arms of the tweezers and the sample piece in the sample piece relocating device according to the embodiment of the present disclosure, a view showing a state in which the arms of the tweezers hold the sample piece.

FIG. 10 is view showing an example of a focused state and interference fringes Fc1, Fc2 in a microscopic image of the arms 81*a* of the tweezers 81 in the sample piece relocating device 10 according to the embodiment of the present disclosure, a view showing a state in which the arms 81*a* hold the sample piece Q.

As shown in FIG. 10, the control device 21 pinches and grips the sample piece Q from both sides thereof in the thickness direction with the front ends of the pair of arms 81*a* in a state in which interference fringes Fc1 and Fc2 are observed by focusing on the surfaces of the sample S and the sample piece Q and the front ends of the pair of arms 81*a* of the tweezers 81. The control device 21 releases the support of the sample piece Q by the support portion Qa (see FIG. 2) of the sample S, and separates the sample piece Q from the sample S by displacing the pair of arms 81*a* holding the sample piece Q in an appropriate direction (e.g., the thickness direction of the sample piece Q).

Next, the control device 21 retracts the pair of arms 81*a* from the sample S by elevating the pair of arms 81*a* of the tweezers 81 upward in the Z-axis direction by the tweezer driving mechanism 83 (Step S18).

FIG. 1 is a view showing an example of a focused state and the interference fringe Fc2 in a microscopic image of the arms 81*a* of the tweezers 81 in the sample piece relocating device 10 according to the embodiment of the present disclosure, a view showing a state in which the arms 81*a* holding the sample piece Q is retracted from the sample S.

Figure 11:
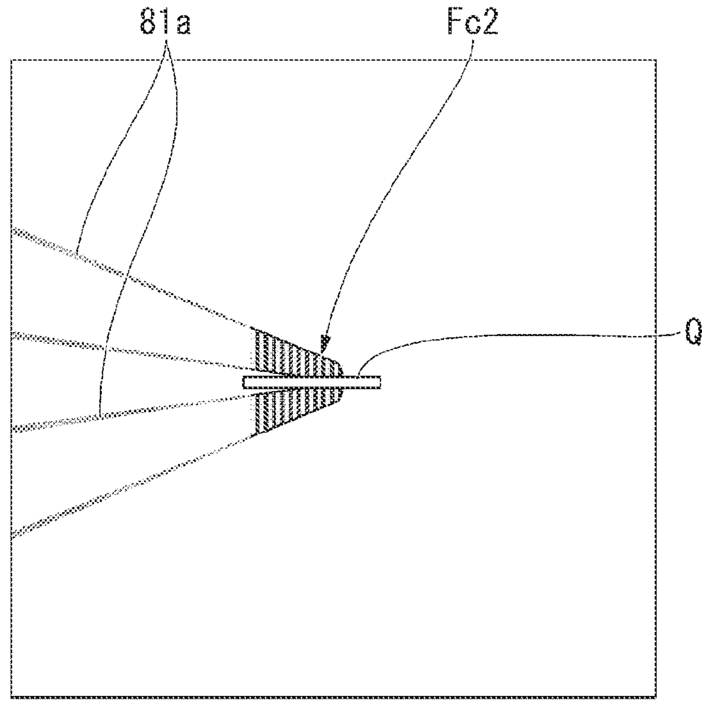
FIG. 11 is a view showing an example of a focused state and an interference fringe in a microscopic image of the arms of the tweezers and the sample piece in the sample piece relocating device according to the embodiment of the present disclosure, a view showing a state in which the arms of the tweezers holding the sample piece are retracted from the sample.

As shown in FIG. 11, the control device 21 retracts the pair of arms 81*a* holding the sample piece Q from the sample S in a state in which focusing is maintained at the front ends of the pair of arms 81*a* of the tweezers 81 and the interference fringe Fc2 is observed, for example.

Next, the control device 21 operates the stage 31*a* by means of the stage driving mechanism 31*b* so that the mounting position of the sample piece Q in the sample piece holder P coincides with the center of field of view of the observation camera 73 (step S19). First, the control device 21 moves the stage 31*a* based on the coordinate information of the stage 31*a* and the mounting position of the sample piece Q in the sample piece holder P matched in the step S07 described above. Then, the control device 21 moves the stage 31*a* based on predetermined reference image data (e.g., a predetermined template) indicating the mounting position of the sample piece Q in the sample piece holder P, and the microscopic image of the sample piece holder P acquired from the observation camera 73. For example, the control device 21 matches the mounting position of the sample piece Q in the sample piece holder P with the center of field of view of the observation camera 73 by template matching the predetermined template with the template in the microscopic image. At this time, instead of template matching, the mounting position may be derived based on an extracted edge position after detecting an edge at a position offset from the mounting position of the sample piece Q. This is effective when the field of view required for template matching is not obtained.

Next, based on the position of the front ends of the pair of arms 81*a* of the tweezers 81 determined in step S13 described above, the control device 21 moves the pair of arms 81*a* by the tweezer driving mechanism 83 so that the position of the front ends of the pair of arms 81*a* coincides with the center of field of view of the observation camera 73 (step S20).

Next, the control device 21 determines (step S21) whether there is contact between the front ends of the pair of arms 81*a* or the sample piece Q held at the front ends of the pair of arms 81*a* and the mounting position of the sample piece Q in the sample piece holder P based on the signal of the microscopic image output from the observation camera 73, while moving the column 33 in the Z-axis direction by means of the column driving mechanism 35. For example, the control device 21 determines that the front ends of the pair of arms 81*a* or the sample piece Q held at the front ends of the pair of arms 81*a* have come into contact with the sample piece holder P when deformation occurs in the interference fringe of the sample piece holder P detected on the microscopic image output from the observation camera 73.

Next, after contact is made between the front ends of the pair of arms 81*a* of the tweezers 81 or the sample piece Q and the mounting position of the sample piece Q in the sample piece holder P, the control device 21 releases the holding of the sample piece Q by the operation of the pair of arms 81*a* from closing to opening, and mounts the sample piece Q to the sample piece holder P (step S22).

Next, the control device 21 adds information such as a microscopic image of the sample piece holder P after mounting the sample piece Q, mounting position and mounting posture of the sample piece Q in the sample piece holder P to the recipe information of the recipe information generating device 7 (step S23).

Next, the control device 21 determines whether the next sample piece Q is taken out from the sample S.

If the result of this determination is "YES", the control device 21 returns the process to step S08 described above.

On the other hand, if the result of this determination is "NO", the control device 21 advances the process to step S25.

Next, the control device 21 moves the pair of arms 81*a* of the tweezers 81 to a predetermined reference position by means of the tweezer driving mechanism 83 (step S25). Then, the control device 21 advances the process to the end.

As a result of the above, a series of automatic sample piece Q relocating operations are completed.

The flow from the start to the end described above is only an example, and appropriate steps may be replaced or skipped as long as the overall flow is not disturbed. The control device 21 may perform the relocation operation unattended by continuously operating from the start to the end described above.

As described above, the sample piece relocating device 10 of the embodiment may perform a prescribed relocating operation with high accuracy while preventing damage to the sample piece Q by providing the control device 21 that controls the sample piece carrying device 13 based on the information relating to processing (processing recipe) in which the charged-particle beam device 3 is used to prepare the sample piece Q.

Extraction of the sample piece Q from the sample S by the pair of arms 81*a* of the tweezers 81 and transport of the sample piece Q to the sample piece holder P may be performed with high accuracy by providing the control device 21 that controls the stage driving mechanism 31*b*, the column driving mechanism 35, and the tweezer driving mechanism 83 based on interference fringes detected in images output from the observation camera 73 provided in the column 33, which is a so-called two-beam interference optics.

By having the control device 21 that detects the Z position of an observation target according to the intensity or contrast or distribution of the interference fringes detected in the images of the observation target (e.g., the sample S, the sample piece Q, the sample piece holder P, and the pair of arms 81*a* of the tweezers 81, etc.) output from the observation camera 73, even for an observation target having a shape, structure, or size (area, etc.) in which it is difficult to confirm the presence or absence of focusing, the Z position may be detected with high accuracy.

In addition, by having the control device 21 that detects the position (e.g., X-axis coordinate and Y-axis coordinate) of the observation target based on the fiducial mark (e.g., the notch of the sample S and the fiducial mark Pa of the sample piece holder P) detected in the image of the observation target output from the position adjustment camera 75, even when position detection by a microscopic image is difficult, the position of the observation target may be detected with high accuracy.

Furthermore, by having the control device 21 that determines that the pair of arms 81*a* or the sample piece Q held on the pair of arms 81*a* have/has come into contact with the observation target when deformation occurs in the interference fringes detected in the image of the observation target output from the observation camera 73 during extraction of the sample piece Q from the sample S by the pair of arms 81*a* of the tweezers 81 and installation of the sample piece Q to the sample piece holder P by the pair of arms 81*a*, the presence or absence of contact may be detected with high accuracy.

Modified Example

Modifications of the embodiment will be described below. In addition, the same code/symbol is attached/subjected to the same part as in the above-mentioned embodiment, and description is abbreviate/omitted or simplified.

In the above-described embodiment, it is assumed that the optical interferometry device 11 is provided with a Linnik type objective lens (first objective lens 65 and second objective lens 67), but it is not limited thereto, and other interference objective lenses such as a Michelson type or a Mirau type may be provided, for example.

In the above-described embodiment, it is assumed that the control device 21 executes template matching when aligning the processing mark of the sample S with the center of the field of view and when aligning the mounting position of the sample piece Q in the sample piece holder P with the center of the field of view, but it is not limited thereto, and other image recognition process may be performed.

In the above-described embodiment, it is assumed that the charged-particle beam device 3 includes an electron beam column and a focused ion beam column, but it is not limited thereto. For example, the charged-particle beam device 3 may be equipped with only a focused ion beam column without having an electron beam column.

In the above-described embodiment, it is assumed that the outer shape of the sample piece holder P is a disc shape, but it is not limited thereto, and the outer shape of the sample piece holder P may be of a different shape. For example, the outer shape of the sample piece holder P may be a shape in which a part of the disc is omitted or a semicircular plate shape. For example, the sample piece holder P may be provided with a plurality of comb-shaped columnar parts.

The embodiments of the present disclosure are presented as examples and are not intended to limit the scope of the invention. These embodiments may be implemented in various other forms, and various omissions, substitutions, and changes may be made without departing from the gist of the invention. These embodiments and variations thereof are included in the scope of the invention described in the claims and their equivalents in the same way that they are included in the scope and gist of the invention.

DESCRIPTION OF NUMERALS

1: thin piece sample observation system, 3: charged-particle beam device, 5: transmission electron microscope, 7: recipe information generating device, 10: sample piece relocating device, 11: optical interferometry device, 13: sample piece carrying device (sample piece carrying mechanism), 15: load port, 17: sample carrying device, 19: sample piece holder carrying device, 21: control device, 23: input device, 25: display device, 31: sample stand. 31*a* stage, 31*b*: stage driving mechanism, 33: column (optics), 35: column driving mechanism (optics driving mechanism), 69A: reference surface, 73: observation camera (image capture device, first image capture device), 75: position adjustment camera (second image capture device), 81: tweezers (sample piece holding portion), Fa, Fb, Fc1, Fc2: interference fringes, S: sample (observation target), Q: sample piece (observation target), P: sample piece holder (observation target). Pa: fiducial mark. Ref: reference mark

The invention claimed is:

1. A sample piece relocating device, comprising:

a sample piece carrying mechanism;

a stage;

a stage driving mechanism;

optics configured to split predetermined light emitted from a light source to irradiate an observation target and a reference surface and synthesize a reflected light from the observation target and a reflected light from the reference surface to form an image of synthesized light representing a state of interference of the two reflected lights;

an image capture device;

an optics driving mechanism; and a control device configured to:

control the stage driving mechanism to move the stage based on information relating to a processing to prepare a sample piece from a sample by irradiating the sample with a charged-particle beam using a charged-particle beam device, wherein the stage is configured to maintain both the sample and a sample piece holder;

control the optics driving mechanism to move the optics relative to the stage to change a distance between the optics and the stage based on the state of interference detected in the image captured by the optics while moving the optics;

obtain, from the image capture device, a signal of an image obtained by capturing the image formed by the optics while moving the optics;

detect a position of the observation target based on 1) coordinate data representing a position of the optics in real space at a point where intensity or contrast of interference fringes detected in the image is maximized while moving the optics by means of the optics driving mechanism and 2) a distribution of the interference fringes by: (a) acquiring a microscopic image containing the distribution of the interference fringes, (b) identifying a number of interference fringes observed on surfaces of the observation target corresponding to a height difference of the surfaces of the observation target, and (c) determining the position of the observation target based on the identified number of the interference fringes;

control the sample piece carrying mechanism to separate, extract, and hold the sample piece from the sample based on the information relating to the processing, on the detected position of the observation target, and on the state of interference detected in the image captured by the optics while moving the optics; and control the sample piece carrying mechanism to carry the sample piece to the sample piece holder based on the information relating to the processing, on the detected position of the observation target, and on the state of interference detected in the image captured by the optics while moving the optics, wherein the information relating to the processing comprises information on a position of the sample piece based on coordinates of processing positions of the charged-particle beam device.

2. The sample piece relocating device according to claim 1, wherein the control device determines that a sample piece holding portion of the sample piece carrying mechanism or the sample piece held by the sample piece holding portion has come into contact with the observation target when deformation occurs in the interference fringes detected in the image obtained from the image capture device when the sample piece carrying mechanism is operated.

3. The sample piece relocating device according to claim 1, further comprising:

a first image capture device that is the image capture device that captures the image formed by the optics; and a second image capture device that outputs a signal of the image obtained by capturing an image of the observation target, wherein the control device detects the position of the observation target based on positional information of a fiducial mark detected in the image outputted by the second image capture device.

* * * * *